United States Patent
Jung et al.

(10) Patent No.: US 10,229,953 B2
(45) Date of Patent: Mar. 12, 2019

(54) SUBSTRATE FOR TRANSPARENT FLEXIBLE DISPLAY AND ORGANIC LIGHT-EMITTING DIODE DISPLAY INCLUDING THE SAME

(71) Applicant: Samsung Display Co., Ltd., Yongin-si, Gyeonggi-do (KR)

(72) Inventors: Seung Ho Jung, Yongin-si (KR); Chaun Gi Choi, Yongin-si (KR); Hye Young Park, Yongin-si (KR); Eun Young Lee, Yongin-si (KR); Joo Hee Jeon, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/013,852

(22) Filed: Feb. 2, 2016

(65) Prior Publication Data

US 2016/0315124 A1    Oct. 27, 2016

(30) Foreign Application Priority Data

Apr. 21, 2015  (KR) .................. 10-2015-0056147

(51) Int. Cl.
*H01L 27/32* (2006.01)
*H01L 51/52* (2006.01)
*H01L 51/00* (2006.01)

(52) U.S. Cl.
CPC ...... *H01L 27/3206* (2013.01); *H01L 51/5284* (2013.01); *H01L 51/0097* (2013.01); *H01L 51/524* (2013.01); *H01L 2251/5338* (2013.01)

(58) Field of Classification Search
CPC .......................... H01L 27/3206; H01L 27/32
See application file for complete search history.

(56) References Cited

U.S. PATENT DOCUMENTS

| | | | |
|---|---|---|---|
| 6,844,673 B1* | 1/2005 | Bernkopf | H01L 27/3253 313/498 |
| 8,309,113 B2 | 11/2012 | Hofmann et al. | |
| 2010/0101649 A1 | 4/2010 | Huignard et al. | |
| 2011/0222142 A1* | 9/2011 | Arsenault | B82Y 20/00 359/297 |
| 2014/0273319 A1* | 9/2014 | Shieh | H01L 27/322 438/27 |

FOREIGN PATENT DOCUMENTS

| | | |
|---|---|---|
| KR | 10-2009-0082217 A | 7/2009 |
| KR | 10-2014-0062237 A | 5/2014 |

OTHER PUBLICATIONS

W. Zhang et al., "Full color organic light-emitting devices with microcavity structure and color filter", Optics Express, Apr. 29, 2009.*

(Continued)

*Primary Examiner* — Michael Lebentritt
*Assistant Examiner* — Suberr Chi
(74) *Attorney, Agent, or Firm* — F. Chau & Associates, LLC

(57) ABSTRACT

A substrate of a transparent flexible display and an organic light-emitting diode display including the same are disclosed. In one aspect, the substrate includes a first polymer film having a predetermined color and a second polymer film having an inverse opal structure formed on a surface of the first polymer film.

13 Claims, 3 Drawing Sheets

(56) References Cited

OTHER PUBLICATIONS

E. Armstrong et al. "Artificial opal photonic crystals and inverse opal structures—fundamentals and applications from optics to energy storage", J. Mater. Chem. C., May 2015, vol. 3, 6109.*

X. Zhang et al. "Polymer Sol-Gel Composite Inverse Opal Structures", Mar. 2015, ACS Appl. Mater. Interfaces, vol. 7, 6054.*

N. Akamatsu et al. "Photoresponsive Liquid-Crystalline Polymer Films Bilayered with an Inverse Opal Structure", Aug. 2016, J. Photopolym. Sci. Technol., vol. 29, 145.*

G.-Z. Han et al. "Phototunable photonic crystals with reversible wavelength choice", 2007, Appl. Phys. Lett., vol. 91, 141114.*

Aguirre et al., "Tunable Colors in Opals and Inverse Opal Photonic Crystals," *Adv. Funct. Mater.* 2010, 20, pp. 2565-2578.

Chen et al., "Fabrication of closed-cell polyimide inverse opal photonic crystals with excellent mechanical properties and thermal stability," *J. Mater. Chem.*, 2008, 18, pp. 2262-2267.

Josephson et al., "Inverse Opal SiO2 Photonic Crystals as Structurally-Colored Pigments with Additive Primary Colors," *Z. Anorg. Allg. Chem.* 2014, 640, (3-4), pp. 655-662.

Escalé et al., "Recent advances in honeycomb-structured porous polymer films prepared via breath figures," *European Polymer Journal* 48 (2012) pp. 1001-1025.

Gu et al., "Structural Color and the Lotus Effect," *Angew. Chem. Int. Ed.* 2003, 42, No, 8, pp. 894-897.

* cited by examiner

SUBSTRATE FOR TRANSPARENT FLEXIBLE DISPLAY AND ORGANIC LIGHT-EMITTING DIODE DISPLAY INCLUDING THE SAME

INCORPORATION BY REFERENCE TO ANY PRIORITY APPLICATIONS

This application claims priority to and the benefit of Korean Patent Application No. 10-2015-0056147, filed on Apr. 21, 2015, in the Korean Intellectual Property Office, the entire content of which is incorporated herein by reference in its entirety.

BACKGROUND

Field

The described technology generally relates to a substrate for transparent flexible display and an organic light-emitting diode display including the same.

Description of the Related Technology

A transparent flexible display uses a polymer substrate that functions as a backplane of an organic light-emitting diode (OLED). The substrate can include a colored polymer substrate and a transparent polymer substrate.

The colored polymer substrate has good thermal resistance (e.g. >450° C.) and mechanical properties by forming a charge transfer complex (CTC). A representative example can be a colored polyimide film.

The transparent polymer substrate is made by restricting formation of the CTC into a film. In order to form a transparent polymer film, a functional group with strong electro negativity is introduced into the polymer such as —CF$_3$ and —SO$_2$, which causes the π electron density in a chain to be reduced. And a bulky group is introduced in a polymer chain and steric hindrance can occur.

However, in the case of a flexible display device including a colored polymer substrate, since the colored polymer forms the CTC and absorbs visible light wavelengths in a visible ray area, a yellow film is formed after coating and hardening. It then becomes difficult to apply the colored polymer substrate itself in a transparent flexible device because of a large yellow index.

On the other hand, in the case of a transparent polymer applied flexible display device, it is desirable to have the existing processing temperature (<400° C.) be reduced because of the reduction in thermostable property according to the restriction on the formation of the CTC.

Consequently, research is being conducted to identify the technology that can implement a transparent flexible display by tuning the colored polymer substrate.

SUMMARY OF CERTAIN INVENTIVE ASPECTS

One inventive aspect relates to a polymer substrate for transparent flexible display comprising a backplane of an organic light-emitting diode (OLED) to which a polymer film having an inverse opal structure is applied and an OLED display employing the same.

Another aspect is a panel for flexible display panel that can implement a transparent flexible display while applying a colored polymer substrate.

Another aspect is an OLED display employing a substrate for flexible display that can implement a transparent flexible display while applying a colored polymer substrate.

Another aspect is a substrate for transparent flexible display including a colored polymer film and a polymer film having an inverse opal structure formed on any one surface of the colored polymer film.

Another aspect is an OLED display including a backplane having a colored polymer film and a polymer film including an inverse opal structure formed on any one surface of the colored polymer film, an organic light emitting portion on the backplane and an encapsulation portion on the organic light emitting portion.

The colored polymer film can be a flat film having a nonporous structure.

The polymer film having the inverse opal structure and the colored polymer film can be polyimide films.

The colored polymer film with the inverse opal structure is provided on a lower surface of the colored polymer film.

The polymer film having the inverse opal structure can have a blue color and the colored polymer film can have a yellow color.

The polymer film having the inverse opal structure can control sizes of pores in the inverse opal structure to have the blue color. The sizes of the pores in the inverse opal structure can be 250 nm to 290 nm.

When the yellow color of the colored polymer film and the blue color of the polymer film having the inverse opal structure are mixed, additive color mixing occurs so as to color-shift to a transparent color.

Since it is possible to implement a transparent flexible display device by applying a colored polymer substrate, a favorable characteristic of applying the colored polymer substrate, which has excellent thermostable property (>450° C.) and mechanical property, can be sustained.

Since the transparent flexible display substrate can be mechanically attachable to or detachable from a carrier glass after a panel is manufactured, a problem with laser desorption attributed to complexity of process and damage caused by laser can be avoided.

Another aspect is a substrate of a transparent flexible display, comprising: a first polymer film having a predetermined color; and a second polymer film having an inverse opal structure formed on a surface of the first polymer film.

In the above substrate, the first polymer film includes a substantially flat film having a nonporous structure.

In the above substrate, the first and second polymer films include polyimide.

In the above substrate, the inverse opal structure is formed on a lower surface of the first polymer film in the depth dimension of the substrate.

In the above substrate, the second polymer film has a blue color, wherein the colored polymer film has a yellow color.

In the above substrate, the inverse opal structure of the second polymer film has a plurality of pores having predetermined sizes so as to have the blue color.

In the above substrate, the sizes of the pores in the inverse opal structure are in the range of about 250 nm to about 290 nm.

Another aspect is an organic light-emitting diode (OLED) display, comprising: a backplane including a first polymer film having a predetermined color and a second polymer film having an inverse opal structure formed on a surface of the first polymer film; an organic light-emitting portion formed over the backplane; and an encapsulation layer formed over the organic light-emitting portion.

In the above OLED display, the first polymer film includes a substantially flat film having a nonporous structure.

In the above OLED display, the first and second polymer films include polyimide.

In the above OLED display, the second polymer film is formed on a lower surface of the first polymer film in the depth dimension of the OLED display.

In the above OLED display, the second polymer film has a blue color, wherein the first polymer film has a yellow color.

In the above OLED display, the inverse opal structure of the second polymer film has a plurality of pores having predetermined sizes so as to have the blue color.

In the above OLED display, the sizes of the pores are in the range of about 250 nm to about 290 nm.

Another aspect is an organic light-emitting diode (OLED) display, comprising: a backplane including a first polymer film having a predetermined color and a second polymer film having an inverse opal structure formed on the first polymer film; and an organic light-emitting portion formed over the backplane, wherein the organic light-emitting portion includes an OLED and a thin film transistor electrically connected to the OLED.

In the above OLED display, the thicknesses of the first and second polymer films are substantially uniform throughout the OLED display.

In the above OLED display, the second polymer film is formed on a lower surface of the first polymer film in the depth dimension of the OLED display.

In the above OLED display, the second polymer film has a blue color, and wherein the first polymer film has a yellow color.

In the above OLED display, the inverse opal structure of the second polymer film has a plurality of pores having predetermined sizes so as to have the blue color.

In the above OLED display, the sizes of the pores are in the range of about 250 nm to about 290 nm.

DETAILED DESCRIPTION OF CERTAIN INVENTIVE EMBODIMENTS

Figure 1:
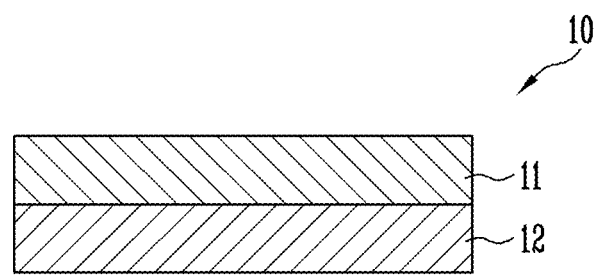
FIG. 1 is a cross sectional view illustrating a polymer substrate for transparent flexible display according to an embodiment.

Example embodiments will now be described more fully hereinafter with reference to the accompanying drawings; however, they can be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions can be exaggerated for clarity of illustration. It will be understood that when an element is referred to as being "between" two elements, it can be the only element between the two elements, or one or more intervening elements can also be present. Like reference numerals refer to like elements throughout.

In the following detailed description, only certain exemplary embodiments have been shown and described, simply by way of illustration. As those skilled in the art would realize, the described embodiments can be modified in various different ways, all without departing from the spirit or scope of the described technology. Accordingly, the drawings and description are to be regarded as illustrative in nature and not restrictive. In addition, it will be understood that when an element or layer is referred to as being "on", "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In this disclosure, the term "substantially" includes the meanings of completely, almost completely or to any significant degree under some applications and in accordance with those skilled in the art. The term "connected" can include an electrical connection.

Figure 2:
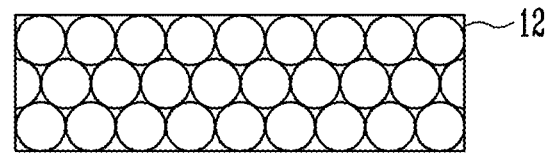
FIG. 2 is a front view illustrating a front surface of a polymer film having an inverse opal structure forming a polymer substrate in FIG. 1.

FIG. 1 is a cross sectional view schematically illustrating a substrate 10 for a flexible display device according to an embodiment. FIG. 2 is a front view illustrating a front surface of a polymer film having an inverse opal structure forming the substrate 10.

Referring to FIGS. 1 and 2, the substrate 10 for the flexible display device can be a polymer substrate which includes a colored polymer film 11 and a polymer film 12 having an inverse opal structure formed on any one surface of the colored polymer film.

The colored polymer film 11 can have a smooth surface having a nonporous structure. The colored polymer film 11 can display a yellow color.

A polymer film 12 having an inverse opal structure can be formed on any one surface of the colored polymer film 11.

The inverse opal structure can have a porous structure having pores of substantially uniform size, regularly arranged, as shown in FIG. 2. By controlling the substantially uniform pore sizes, a blue color can be displayed. The pore sizes (or diameter) in the inverse opal structure capable of expressing a blue color can be from about 250 nm to about 290 nm.

Figure 3:
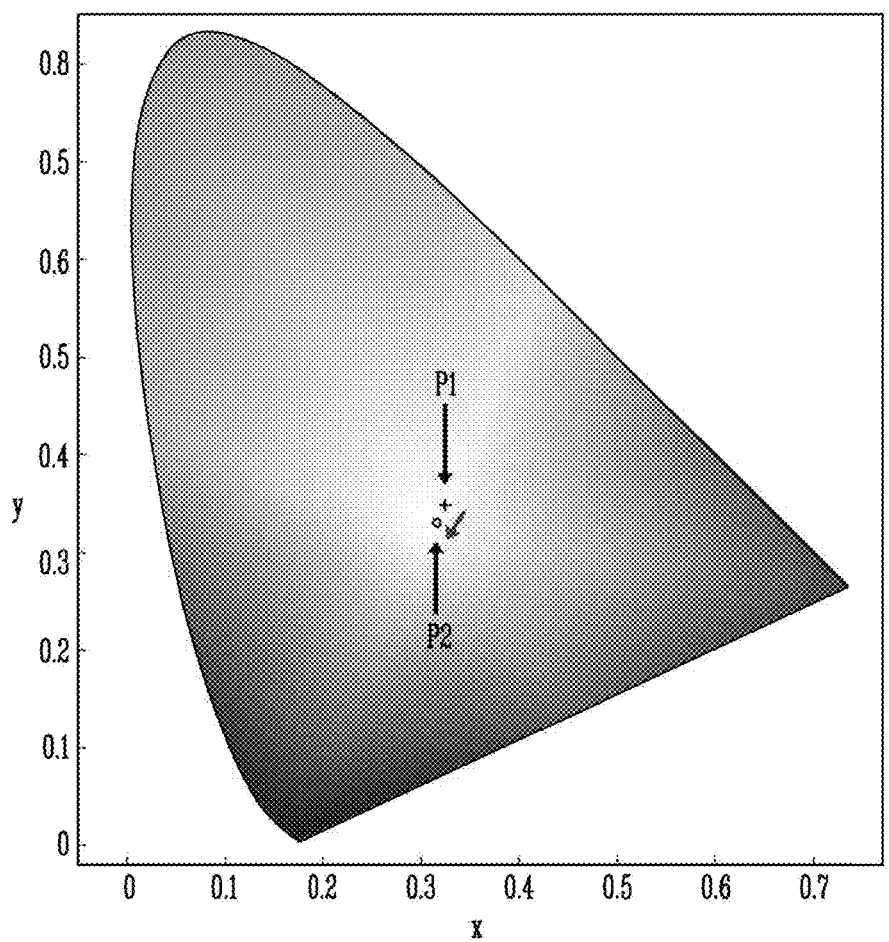
FIG. 3 illustrates CIE 1931 color coordinate optical simulations showing occurrence of a color shift of a polymer substrate.

FIG. 3 illustrates CIE 1931 color coordinate optical simulations showing occurrence of a color shift of a polymer substrate.

Referring to FIGS. 1 to 3, a yellow color P1 of the colored polymer film 11 and a blue color of the colored polymer film 11 of the inverse opal structure are additively mixed and a color shift can occur to a transparent color P2.

In an embodiment, the substrate 10 for the flexible display device is described with the colored polymer film 11 of a yellow color and the polymer film 12 having the inverse opal structure that can display a blue color as examples. However, a polymer film that adjusts pore sizes in an inverse opal structure in order to express a color that causes a color shift to a transparent color by being additively mixed with a colored polymer film of a different color can be used.

The colored polymer film 11 and the polymer film 12 of the inverse opal structure can both be polyimide films.

Also, any one surface of the colored polymer film 11 where the polymer film 12 of the inverse opal structure is formed can be a lower surface of the colored polymer film.

In an embodiment, the substrate 10 for the flexible display device can be employed as a flexible polymer substrate of a backplane in an OLED display.

Figure 4:
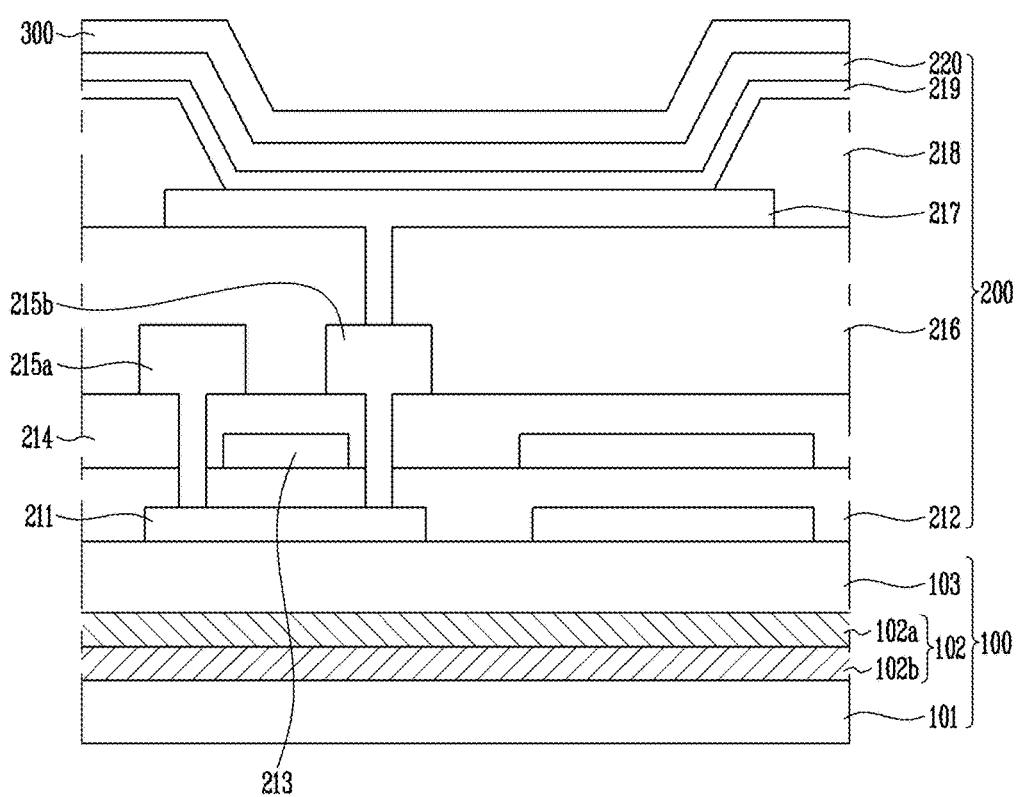
FIG. 4 is a cross sectional view illustrating a cross section of an OLED with a substrate for transparent flexible display applied according to an embodiment.

FIG. 4 is a cross sectional view illustrating a cross section of an OLED display to which a polymer substrate for transparent flexible display is applied.

Referring to FIG. 4, regarding a blackplane 100 of an OLED, a flexible polymer substrate 102 can be formed on a carrier substrate 101. The flexible polymer substrate 102 can be formed of a colored polymer film 102a and a polymer film 102b of an inverse opal structure on a lower surface of the colored polymer film 102a.

The colored polymer film 102a and the polymer film 102b of the inverse opal structure are described as above.

The carrier substrate 101 can have a smooth surface on at least one side and can be formed of glass. The carrier substrate 101 can be removed after the OLED display is formed.

On the carrier substrate 101, the polymer film 102b of the inverse opal structure and the flexible polymer substrate 102 formed of the colored polymer substrate 102a can be formed.

Also, in a flexible display device, while the flexible polymer substrate 102 is formed of a synthetic resin material having flexibility, a reinforcement layer can be further formed on the carrier substrate 101 formed of glass, with an aim to improve adhesive property between the polymer substrate 102 and the carrier substrate 101.

A barrier layer 103 can be formed on the polymer substrate 102. For example, the barrier layer 104 can be formed on the carrier substrate 101 to cover an upper portion of the polymer substrate 102 and cover a side portion of the polymer substrate 102.

The barrier layer 103 can prevent foreign materials such as oxygen and moisture from penetrating into an organic light emitting portion via the carrier substrate 101 and the polymer substrate 102. The barrier layer 103 can be formed of an inorganic matter. The barrier layer 103 can be formed of an inorganic layer of multiple layers. The barrier layer 103 can be multilayer films with silicon oxide (SiOx) layer and silicon nitride (SiNx) layer alternately stacked. The barrier layer 103 can be formed by a plasma enhanced chemical vapor deposition (PECVD) process.

An organic light emitting portion 200 and an encapsulation portion 300 can be formed on the barrier layer 103 of the backplane to which a polymer substrate for transparent flexible display is applied.

The organic light emitting portion 200 can be formed of a pixel circuit portion and an OLED.

The organic light emitting portion 200 can be formed by the pixel circuit portion and the OLED sequentially forming on the barrier layer 103. The pixel circuit portion can be a thin film transistor (TFT).

An active layer 211 of a preset pattern can be provided on the barrier layer 103 of the backplane 100. A gate insulating layer 212 can be provided on an upper portion of the active layer 211, and a gate electrode 213 can be formed in a preset area of the upper portion of the gate insulating layer 212. The gate electrode 213 can be coupled to a gate line (not shown) which applies an on/off signal for a thin film transistor. An interlayer insulating layer 214 can be formed at the upper portion of the gate electrode 213. Source/drain electrodes 215a and 215b can be formed, contacting source/drain areas of the active layer 211, respectively, via contact holes. An insulating layer 216 can be formed on upper portions of the source/drain electrodes 215a and 215b. As a result, a pixel circuit portion can be formed.

The insulating layer 216 can be a passivation layer formed of $SiO_2$, SiNx and the like. On an upper portion of the passivation layer 216 which is an insulating layer, a planarization layer (not shown) can be formed of organic material such as acryl, polyimide and benzocyclobutene (BCB).

A pixel electrode 217 which becomes an anode of an OLED can be formed on the upper portion of the passivation layer, and a pixel define layer 218 can be formed with organic material, to cover the pixel electrode 217. After a preset opening is formed in the pixel define layer 218, an emitting layer 219 can be formed on an upper portion of the pixel electrode 217 exposed by forming an upper portion of the pixel define layer 218 and an opening. However, the described technology is not limited thereto; various structures of OLED display can be applied.

The OLED displays preset image information by emitting red, green or blue light according to a flow of a current. The OLED can include a pixel electrode 217 that is coupled to a drain electrode 215 of a thin film transistor and that receives plus power, a counter electrode 220 configured to over an entire pixel and supplying minus power and a emitting layer 219 emitting light between the pixel electrode 217 and the counter electrode 220.

The pixel electrode 217 and the counter electrode 220 can be insulated from each other by the emitting layer 219. Light can be emitted from the emitting layer 219 by applying voltages having different polarities to the emitting layer 219.

For the emitting layer 219, a low molecule or high molecule organic layer can be used. If a low molecular organic layer is used, the emitting layer 219 can have a single layer structure or a multilayer structure stacking a hole injection layer HIL, a hole transport layer HTL, an emission layer EML, an electron transport layer ETL, an electron injection layer EIL, and the like. The organic materials can include at least one of copperphthalocyanine (CuPc), N,N'-Di(naphthalene-1-yl)-N,N'-diphenylbenzidine (NPB), tris-8-hydroxyquinoline aluminum (Alq3), and the like, which can be applied in a variety of ways. The low molecular organic layers can be formed using a vacuum deposition method.

A high molecular organic layer can have a structure generally including the hole transport layer HTL and the emission layer EML. PEDOT can be used for the hole transport layer HTL, and high molecular organic materials such as poly-phenylenevinylene and polyfluorene can be used for the emission layer. The hole transport layer HTL and the emission layer can be formed using screen printing or ink jet printing methods. The emitting layer is not limited thereto, but various embodiments can be applied.

The emitting layer 219 can be formed using a spin coating method. For example, an organic material is coated to cover the pixel electrode 217 and the pixel define layer 218.

The pixel electrode 217 can function as an anode, and the counter electrode 220 can function as a cathode. The polarities of the pixel electrode 218 and the counter electrode 220 can be opposite to each other.

The pixel electrode 217 can be provided with a transparent electrode or a reflector electrode. When it is used as a transparent electrode, it can be formed of ITO, IZO, ZnO or In$_2$O$_3$. When it is used as a reflector electrode, after a reflection layer is formed of Ag, Mg, Al, Pt, Pd, Au, Ni, Nd, Ir, Cr or any compound thereof, ITO, IZO, ZnO or In$_2$O$_3$ can be formed thereon.

The counter electrode 220 can be provided with a reflector electrode. When it is used as a transparent electrode, the counter electrode 220 can be used as a cathode. After a metal having small work function, that is, Li, Ca, LiF/Ca, LiF/Al, Al, Ag, Mg or any compound thereof, is deposited to face a direction of the emitting layer, an auxiliary layer or a bus electrode line can be formed thereon with a material for forming transparent electrode such as ITO, IZO, ZnO or In$_2$O$_3$. When it is used as a reflector electrode, Li, Ca, LiF/Ca, LiF/Al, Al, Ag, Mg or any compound thereof can be formed by depositing them on a front surface.

After the organic light emitting portion 200 is formed, the organic emitting portion 200 can be sealed with an encapsulation portion 300. The encapsulation 300 can be formed by alternately stacking an organic thin film layer and an inorganic thin film layer. Or, in another embodiment, it can be formed of a metal layer.

A delamination process which separates the flexible polymer substrate 102 from the carrier substrate 101 can be performed. The flexible polymer substrate 102 can mechanically separate the carrier substrate 101 without a laser desorption process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment can be used singly or in combination with features, characteristics, and/or elements described in connection with other embodiments unless otherwise specifically indicated. Accordingly, it will be understood by those of skill in the art that various changes in form and details can be made without departing from the spirit and scope of the present invention as set forth in the following claims.

What is claimed is:

1. An organic light-emitting diode (OLED) display, comprising:
    a backplane including a first polymer film layer having a first color and a second polymer film having an inverse opal structure formed directly on a surface of the first polymer film layer;
    an organic light-emitting portion formed over the backplane; and
    an encapsulation layer formed over the organic light-emitting portion,
    wherein the second polymer film expressese a second color.

2. The OLED display as claimed in claim 1, wherein the first polymer film layer includes a substantially flat film having a nonporous structure.

3. The OLED display as claimed in claim 1, wherein the first polymer film layer and second polymer film include polyimide.

4. The OLED display as claimed in claim 1, wherein the second polymer film is formed on a lower surface of the first polymer film layer in a depth dimension of the OLED display.

5. The OLED display as claimed in claim 1, wherein the second polymer film has a blue color, and wherein the first polymer film layer has a yellow color.

6. The OLED display as claimed in claim 5, wherein the inverse opal structure of the second polymer film has a plurality of pores having predetermined sizes so as to have the blue color.

7. The OLED display as claimed in claim 6, wherein the sizes of the pores are in the range of about 250 nm to about 290 nm.

8. An organic light-emitting diode (OLED) display, comprising:
    a backplane including a first polymer film layer having a first color and a second polymer film having an inverse opal structure formed directly on the first polymer film layer; and
    an organic light-emitting portion formed over the backplane,
    wherein the organic light-emitting portion includes an OLED and a thin film transistor electrically connected to the OLED, and
    wherein the second polymer film expresses a second color.

9. The OLED display as claimed in claim 8, wherein the thicknesses of the first polymer film layer and and second polymer film are substantially uniform throughout the OLED display.

10. The OLED display as claimed in claim 9, wherein the second polymer film is formed on a lower surface of the first polymer film layer in a depth dimension of the OLED display.

11. The OLED display as claimed in claim 9, wherein the second polymer film has a blue color, and wherein the first polymer film layer has a yellow color.

12. The OLED display as claimed in claim 11, wherein the inverse opal structure of the second polymer film has a plurality of pores having predetermined sizes so as to have the blue color.

13. The OLED display as claimed in claim 12, wherein the sizes of the pores are in the range of about 250 nm to about 290 nm.

* * * * *